(12) United States Patent
Stancil

(10) Patent No.: US 6,636,943 B1
(45) Date of Patent: Oct. 21, 2003

(54) METHOD FOR DETECTING CONTINUITY MODULES IN A DIRECT RAMBUS DRAM SUBSYSTEM

(75) Inventor: Charles J. Stancil, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/364,716

(22) Filed: Jul. 30, 1999

(51) Int. Cl.[7] .......................... G06F 12/00; G06F 13/16
(52) U.S. Cl. ..................... 711/115; 711/105; 714/718
(58) Field of Search .............................. 711/5, 104, 105, 711/115, 170; 714/718; 326/30

(56) References Cited

U.S. PATENT DOCUMENTS

| | | | | |
|---|---|---|---|---|
| 6,003,121 A | * | 12/1999 | Wirt ........................... | 711/170 |
| 6,047,343 A | * | 4/2000 | Olarig ......................... | 710/102 |
| 6,230,274 B1 | * | 5/2001 | Stevens et al. ............... | 713/320 |
| 6,253,284 B1 | * | 6/2001 | Hsu ............................ | 711/115 |
| 6,357,018 B1 | * | 3/2002 | Stuewe et al. ............... | 714/37 |

OTHER PUBLICATIONS

Direct Rambus Technology Disclosure, Rambus Inc., pp. 1–16, Oct. 1997.*
Rambus®RIMM™ Connector, www.rambus.com, 7/99, Revision 1.0, 10 pages.
Direct Rambus®RIMM™ Continuity Module, www.rambus.com, 8/99, Revision 1.0, 5 pages.
Direct Rambus™ SPD Specification 1.0, www.rambus.com, 3/99, Revision 1.0, 60 pages.

* cited by examiner

Primary Examiner—Gary J Portka

(57) ABSTRACT

A system and method to inform the user that there is a missing Direct RDRAM continuity module in a specific RIMM socket or sockets. Upon system startup, the status of each of the RIMM sockets is checked, and if a socket is empty, this information is provided to the user. This provides a great advantage over known systems, in which the user would only receive a general failure notice, without any indication as to the problem.

20 Claims, 5 Drawing Sheets

METHOD FOR DETECTING CONTINUITY MODULES IN A DIRECT RAMBUS DRAM SUBSYSTEM

FIELD OF THE INVENTION

This application relates to computer memory systems, and in particular to techniques for managing and diagnosing problems in a computer memory.

BACKGROUND AND SUMMARY OF THE INVENTION

Direct Rambus DRAM (Direct RDRAM) is a relatively new technology in computer memory systems. Produced by Rambus, Inc., the Direct RDRAM defines a new interconnect topology and has a more stringent set of requirements compared to current and previous generation memory interfaces. This application addresses one of the shortcomings of the Direct RDRAM interconnect topology.

The Direct Rambus specification dictates that all Rambus Inline Memory Module (RIMM) memory sockets must be populated with a memory module or a continuity module. Continuity modules simply contain copper traces that complete the connectivity from one side of the RIMM socket to the other. FIGS. 5A–B show an upgrade to the system, with the FIG. 5A showing a system having three memory sockets; one socket has memory module A, while the other two sockets contain continuity modules B and C. In FIG. 5B, continuity module B is removed and replaced by new memory module D.

FIG. 4 shows a typical Direct Rambus RIMM Memory Subsystem 410. In this figure, RIMM sockets 435, 445, and 455 contain RIMM modules 430 and 440 and a continuity module 450, respectively. The Master Device RIMM controller 420 is connected over Rambus channel 460 to each of the RIMM sockets, in series. The Direct Rambus Clock Generator 465 is also connected to each RIMM socket.

Exemplary logic is shown on RIMM module 430, including Direct RDRAM 480 and SPD ROM 470. The continuity module 450 is shown without any logic; basically, this module simply receives the serial signals in one side and passes them out the other. When additional RDRAM is to be installed, it replaces a continuity module in a RIMM socket, e.g., a RIMM module can be put in place of RIMM continuity module 450. Similarly, if a RIMM module is removed, it must be replaced with a continuity module, e.g., RIMM 440 can be replaced with a continuity module. A RIMM socket must not be left empty, however; this renders the RIMM memory subsystem inoperable.

The RIMM socket must always contain (during operation) a RIMM or continuity module because the Direct Rambus architecture employs a terminated serial bus topology, i.e. each set of memory slots is serially connected, and commonly terminated. Although there is a defined mechanism, the Serial Presence Detect (SPD), for sensing and identifying a memory module (RIMM), there is no mechanism to determine whether or not a continuity module is present. If at least one RIMM socket is unpopulated the bus (or Rambus channel) will not function. It is therefore desirable to provide feedback to the user that the memory subsystem is non-functional, why, and how to resolve the situation.
Innovative Mechanism for Detecting Continuity Modules in a Direct Rambus DRAM Subsystem The preferred embodiment provides a system and method to inform the user that there is a missing Direct RDRAM continuity module in a specific RIMM socket or sockets. Upon system startup, the status of each of the RIMM sockets is checked, and if a socket is empty or contains a defective module, this information is provided to the user. This provides a great advantage over known systems, in which the user would only receive a general failure notice, without any indication as to the problem.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
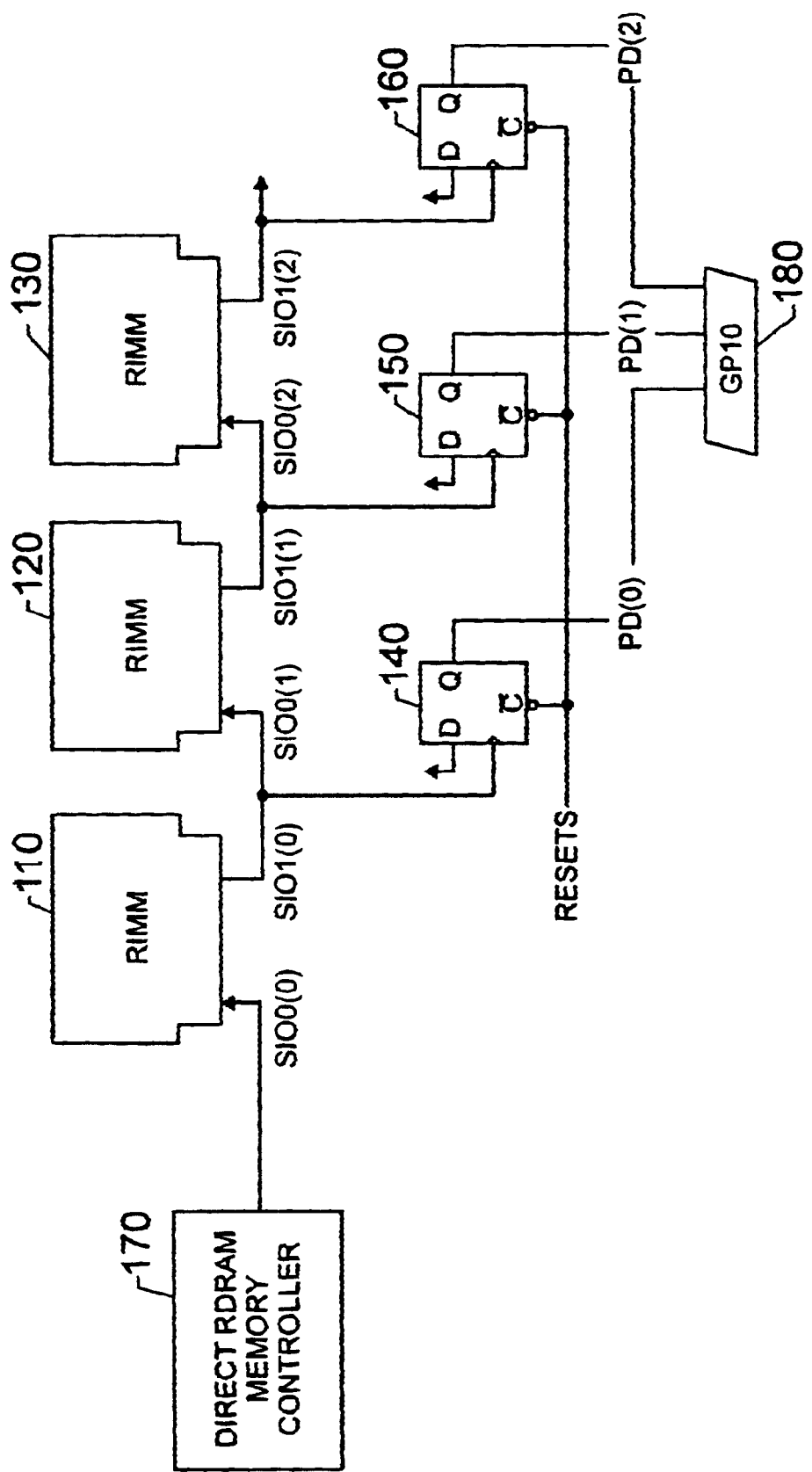
FIG. 1 shows an RDRAM subcircuit with a detection circuit according to the preferred embodiment.

FIG. 1 shows an RDRAM subcircuit with a detection circuit according to the preferred embodiment. RIMM modules 110, 120, and 130 each contain an input signal SIO0 and an output signal SIO1 that are daisy-chained from module to module. For example, the SIO1 from one module is connected to SIO0 of the next module in line. SIO0 for the first module is connected to the Direct RDRAM memory controller 170.

This daisy-chained "bus" is used by the memory controller 170 during the initialization of each RIMM. During initialization, this bus will toggle. By examining the SIO1 signal from each module it can be determined whether or not there is a broken link in the chain, i.e., there is no module present.

The circuit shown in FIG. 1 illustrates a preferred implementation. The SIO1 signal from RIMM socket 110 is routed to flip-flop 140, which is set up as a rising edge detector. Likewise, the SIO1 signal from RIMM socket 120 is routed to flip-flop 150 and SIO1 signal from RIMM socket 130 is routed to flip-flop 160. The output of each flip-flop, which then functions as a presence detect indicator, is routed to a general purpose I/O register (GPIO) 180 in motherboard logic in order to be read by the system BIOS during system initialization.

This process takes place, in the preferred embodiment, during the system Power-On-Self-Test (POST) procedure. When the computer system is first turned on, or undergoes a hard reset, and before it attempts to load the operating system or execute any applications, it performs a POST test, as controlled by the system BIOS. This test typically includes a verification of the presence and proper operation of various system components, including the memory and various I/O devices. In a typical system incorporating Rambus Direct RDRAM, if any RIMM socket were empty, the POST test would report a memory failure, but would give no indication of what the failure is.

Figure 2:
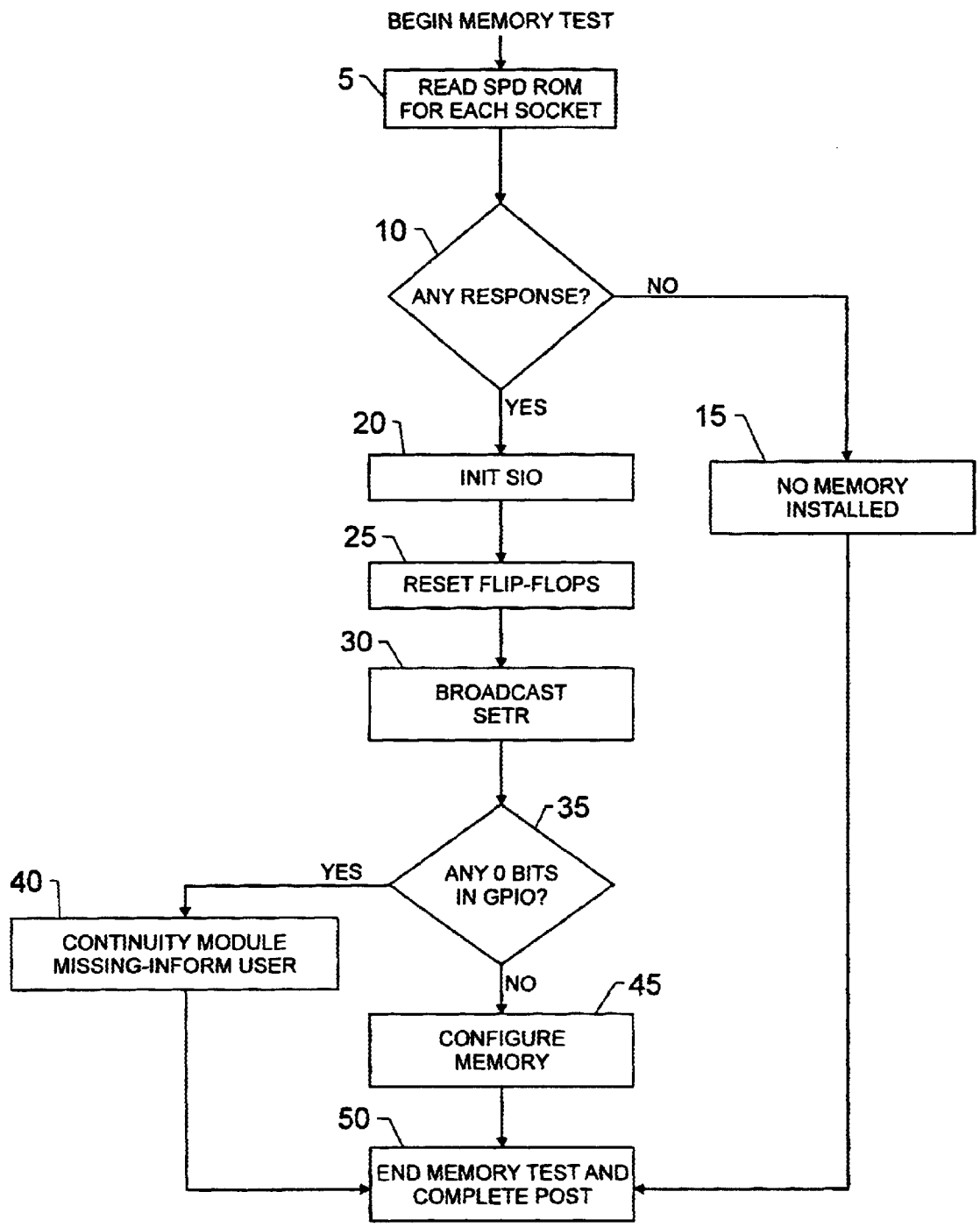
FIG. 2 shows a flowchart of a process according to the preferred embodiment.

According to the preferred embodiment, the POST memory check includes additional steps to analyze any memory problems with the RDRAM. When the POST process reaches the memory test, the flip-flops shown in FIG. 1 are reset. After reset each flip-flop will be cleared and will be awaiting a low-to-high transition on its clock input. The system BIOS will take the following steps to determine the memory module detection and configuration, as shown in the flowchart of FIG. 2.

1. Attempt to read the Serial Presence Detect (SPD) ROM for each RIMM socket. (step 5) If a RIMM module is installed, it will return the contents of its ROM.
2. If no response is received for a given socket (step 10), then that socket is empty or contains a continuity module. If no SPD ROMs are found then inform the user that no memory is installed (step 15), and terminate the process (step 50).
3. Issue the SIO pin initialization sequence (step 20).
4. Reset the PD flip-flops (step 25).
5. Issue a broadcast SETR (Set Reset) command to the RAMBUS channel (step 30). This will generate a bit pattern that includes a 0-to-I transition on the SIO chain. As the flip-flops are triggered, the output is passed to the GPIO register.
6. Examine the presence detect (PD) bit of the GPIO register for each module (step 35). If the PD bit is not set then inform the user that the socket is missing a continuity module (step 40), and terminate the process (step 50).
7. If all PD bits are set and at least one SPD ROM was readable then configure the memory controller accordingly (step 45), and terminate the process (step 50).

After the above memory check is complete, the BIOS completes the POST routine. If a memory failure has occurred due to an empty RIMM socket, the user has now been informed (in step 40, above) as to which socket is empty, and may correct the error. This is a significant advantage over present systems, which would only report a general memory failure.

Figure 3:
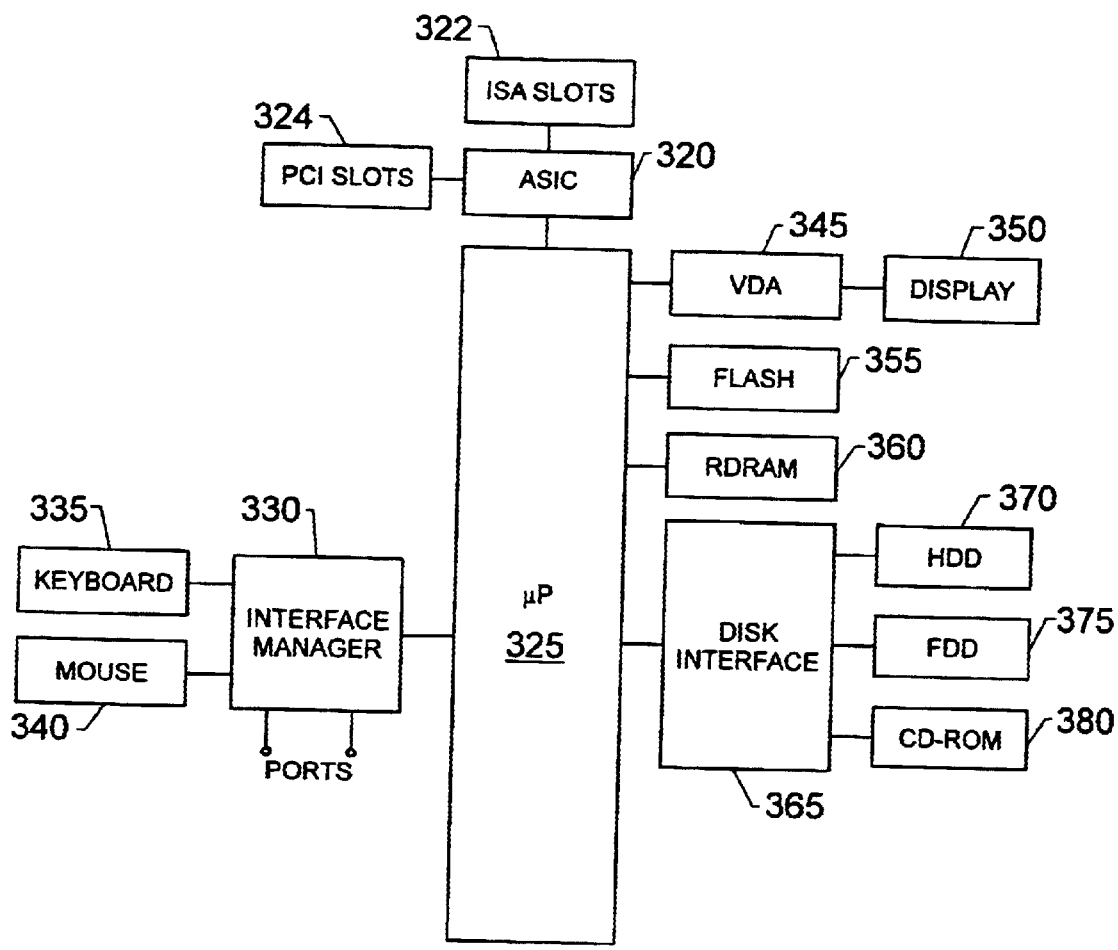
FIG. 3 shows a block diagram of a computer system according to the presently preferred embodiment.
Figure 4:
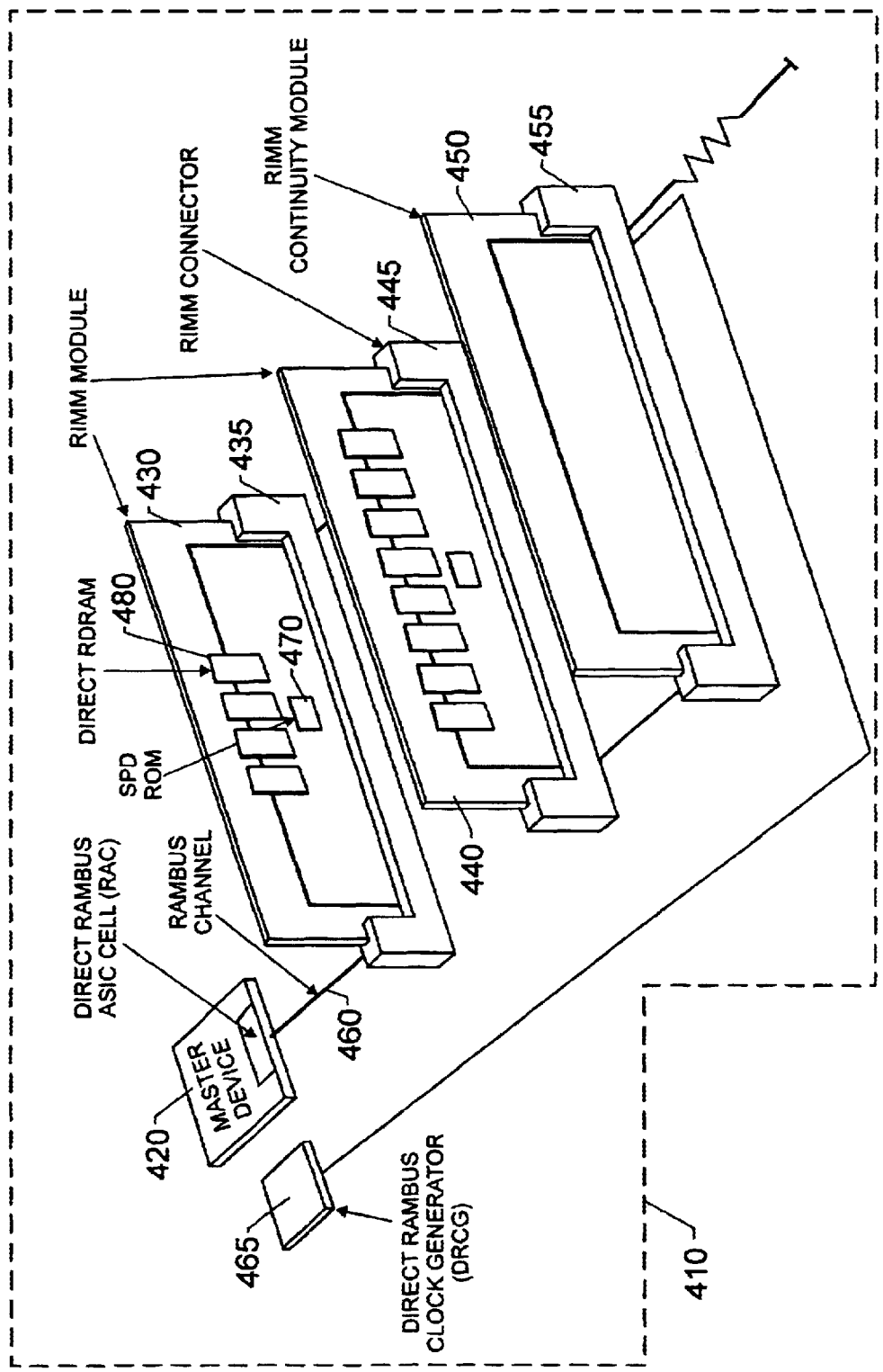
FIG. 4 shows a block diagram of a Direct Rambus RIMM memory subsystem.
Figure 5A:
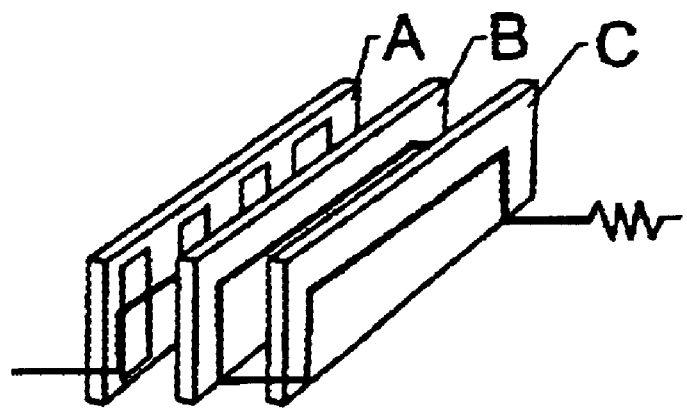
FIGS. 5A–B show a system being upgraded, with the replacement of a continuity module with an RIMM module.
Figure 5B:
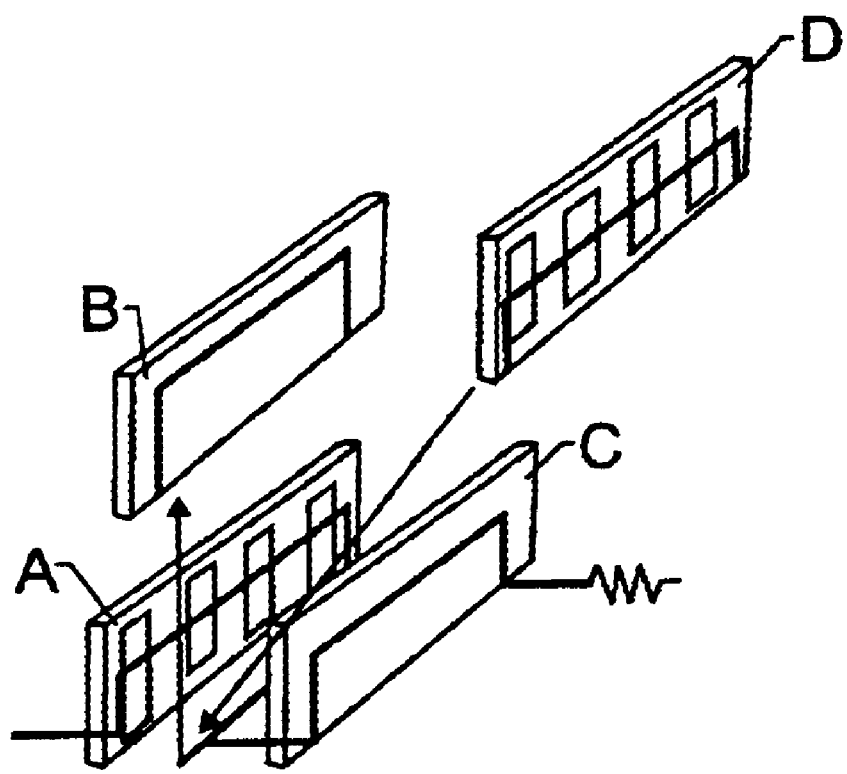

FIG. 3 shows a block diagram of a computer system with an administrative system according to the presently preferred embodiment. The complete computer system includes, in this example:
user input devices (e.g. keyboard 335 and mouse 340);
an ASIC 320 with non-volatile memory, capable of storing configuration data, and connected to disable ISA slots 322 and PCI slots 324.
at least one microprocessor 325 which is operatively connected to receive inputs from said input device, through an interface manager chip 330 (which also provides an interface to the various ports) and from said receiver;
a memory (e.g. flash memory 355 and Direct Rambus RDRAM 360), which is accessible by the microprocessor;
a data output device (e.g. display 350 and display driver card 345) which is connected to output data generated by microprocessor; and
a magnetic disk drive 370, floppy disk drive 375 and CD-ROM 380 which are accessible, through an interface unit 365, by the microprocessor.

Optionally, of course, many other components can be included, and this configuration is not definitive by any means.

Alternate Embodiment

In a less preferable embodiment of the disclosed invention, flip-flop circuits 140 and 150 of FIG. 1 can be omitted, with only flip-flop circuit 160, which is connected to the output of the last module remaining. This configuration can detect that a continuity module is missing, but cannot determine in which location this is true.

According to a disclosed class of innovative embodiments, there is provided: A computer system, comprising: a user input device, a microprocessor which is operatively connected to detect inputs from said input device, and an output device operatively connected to receive outputs from said microprocessor; a plurality of sockets, each connected to communicate with a memory module or a continuity module installed therein, said plurality of sockets being connected in series to communicate with said microprocessor; detection circuitry connected to detect the presence or absence of said continuity module in each of said sockets.

According to another disclosed class of innovative embodiments, there is provided: A computer system, comprising: at least one input device and at least one output device; a main system module which does not include said input and output devices, and which includes therein: at least one microprocessor which is operatively connected to detect inputs from said input device and to send data to said output device, and random-access memory which is connected to be read/write accessible by said microprocessor, said random-access memory being arranged as a plurality of sockets connected in series, each of said sockets configured to receive a memory module or a continuity module; a bus connected to said main system module, and having connections through which additional modules can communicate with said main system module; and a plurality of bistable circuits, each connected to detect the presence or absence of said continuity modules in respective ones of said sockets; wherein upon startup, said system reads said bistable circuits, and reports to the user any socket which contains neither a memory module nor a continuity module.

According to another disclosed class of innovative embodiments, there is provided: A method of checking a memory circuit, comprising the steps of: (a.) passing a signal sequentially between a series of memory sockets; (b.) changing the state of a plurality of bistable circuits as said signal passes between said ones of said series of memory sockets, according to whether respective sockets pass said signal; (c.) reporting an empty socket where indicated by said bistable circuits.

According to another disclosed class of innovative embodiments, there is provided: A method of checking a memory circuit, comprising the steps of: (a.) reading a plurality of memory sockets to determine the presence of memory modules; (b.) if no memory modules are present in any of said memory sockets, then ending; (c.) sending a signal sequentially to each socket; (d.) configuring a plurality of bistable circuits according to whether said signal is passed through respective sockets; and (e.) providing feedback to a user according to the state of said bistable circuits.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Of course, in implementing power supply circuits and systems, safety is a very high priority. Those of ordinary skill in the art will therefore recognize the necessity to review safety issues carefully, and to make any changes in components or in circuit configuration which may be necessary to improve safety or to meet safety standards in various countries.

In the sample computer system embodiment the user input devices can alternatively include a trackball, a joystick, a 3D position sensor, voice recognition inputs, or other inputs. Similarly, the output devices can optionally include speakers, a display (or merely a display driver), a modem, or other outputs.

The present invention, as discussed above, is applied to the direct rambus architecture and the presently recorded embodiment. However, alternatively and less preferably, the disclosed innovations can be applied to other possible architectures in which continuity through a set of modules is required.

In alternative embodiments, possibly with other memory system architectures, it is possible to use other logic signals propagated in a daisy-chain relationship to monitor the continuity of the chain.

Definitions

Following are short definitions of the usual meanings of some of the technical terms which are used in the present application. (However, those of ordinary skill will recognize whether the context requires a different meaning.) Additional definitions can be found in the standard technical dictionaries and journals. In addition, further details of the Rambus architecture, and the function of individual signals within this architecture, are found in *The Direct Rambus™ Technology Disclosure, The Direct Rambus™ SPD Specification, Direct Rambus™ RIMM™ Connector,* and *Direct Rambus™ RIMM™ Continuity Module,* all of which are hereby incorporated by reference. These, and other Rambus related material, may be obtained from Rambus, Inc., at http://www.rambus.com.

Bank: A block of storage cells in the core of the RDRAM.
BIOS: The system BIOS is firmware code containing the routines for the system's basic I/O system, including the code to run the system POST routines.
Broadcast: An operation executed by all RDRAMs.
Channel: ROW/COL/DQ pins and external wires.
CLRR: Clear reset command from SOP field.
CMD: CMOS pin for initialization/power control.
Command: A decoded bit-combination from a field.
CTM,CTMN: Clock pins for transmitting packets.
Current control: Periodic operations to update the proper $I_{OL}$ value of RSL output drivers.
Device: An RDRAM on a Channel.
Field: A collection of bits in a packet.
GPIO: General purpose input/output register.
INIT: Control register with initialization fields.
Initialization: Configuring a Channel of RDRAMs so they are ready to respond to transactions.
Read: Operation of accesssing sense amp data.
Receive: Moving information from the Channel into the RDRAM (a serial stream is demuxed).
Refresh: Periodic operations to restore storage cells.
Retire: The automatic operation that stores write buffer into sense amp after WR command.
SA: Serial address packet for control register transactions w/SA address field.
SBC: Serial broadcast field in SRQ.
SCK: CMOS clock pin.
SD: Serial data packet for control register transactions w/SD data field.
SDEV: Serial device address in SRQ packet.
SDEVID: INIT register field—Serial device ID.
SETR: Set reset command from SOP field.
SINT: Serial interval packet for control register read/write transactions.
SIO0,SIO1: CMOS serial pins for control registers.
SOP: Serial opcode field in SRQ.
SRD: Serial read opcode command from SOP.
SRP: INIT register field—Serial repeat bit.
SRQ: Serial request packet for control register read/write transactions.
Transaction: ROW,COL,DQ packets for memory access.
Transmiit: Moving information from the RDRAM onto the Channel (parallel word is muxed).

Additional general background, which helps to show the knowledge of those skilled in the art regarding the system context, and of variations and options for implementations, may be found in the following publications, all of which are hereby incorporated by reference. In particular, many details may be found in the books from MindShare, Inc., including Protected Mode Software Architecture, CardBus System Architecture, EISA System Architecture, ISA System Architecture, 80486 System Architecture, Pentium Processor System Architecture, PCMCIA System Architecture, Plug and Play System Architecture, PCI System Architecture, USB System Architecture, and Pentium Pro Processor System Architecture, all of which are hereby incorporated by reference, and in the Pentium Processor Family Developer's Manual 1997, the Multiprocessor Specification (1997), the Intel Architecture Optimizations Manual, the Intel Architecture Software Developer's Manual, the Peripheral Components 1996 databook, the Pentium Pro Processor BIOS Writer's Guide (version 2.0, 1996), and the Pentium Pro Family Developer's Manuals from Intel, all of which are hereby incorporated by reference.

What is claimed is:

1. A computer system, comprising:
   a user input device, a microprocessor which is operatively connected to detect inputs from said input device, and an output device operatively connected to receive outputs from said microprocessor;
   a plurality of sockets, each connected to communicate with a memory module or a continuity module installed therein, said plurality of sockets being connected in series to communicate with said microprocessor;
   detection circuitry connected to detect the presence or absence of said continuity module in each of said sockets;
   wherein a report is made to the user of whether any socket contains neither a memory module nor a continuity module.

2. The computer system of claim 1, wherein said plurality of sockets are part of a Rambus Direct RDRAM subsystem.

3. The computer system of claim 1, wherein said continuity module contains no logic or memory circuits.

4. The computer system of claim 1, wherein said detection circuitry comprises a respective flip-flop circuit connected to an output of each of said plurality of sockets.

5. A computer system, comprising:
   at least one input device and at least one output device;
   a main system module which does not include said input and output devices, and which includes therein: at least one microprocessor which is operatively connected to detect inputs from said input device and to send data to said output device, and random-access memory which is connected to be read/write accessible by said microprocessor, said random-access memory being arranged as a plurality of sockets connected in series, each of said sockets configured to receive a memory module or a continuity module;

a bus connected to said main system module, and having connections through which additional modules can communicate with said main system module; and a plurality of bistable circuits, each connected to detect the presence or absence of said continuity modules in respective ones of said sockets;

wherein upon startup, said system reads said bistable circuits, and reports to the user any socket which contains neither a memory module nor a continuity module.

6. The computer system of claim 5, wherein said input device comprises a keyboard.

7. The computer system of claim 5, wherein said continuity module contains no logic or memory circuits.

8. The computer system of claim 5, wherein said plurality of sockets are part of a Rambus Direct RDRAM subsystem.

9. The computer system of claim 5, wherein said detection circuitry comprises a respective flip-flop circuit connected to an output of each of said plurality of sockets.

10. A method of checking a memory circuit, comprising the steps of:
   (a.) passing a signal sequentially between a series of memory sockets;
   (b.) changing the state of a plurality of bistable circuits as said signal passes between said ones of said series of memory sockets, in response to whether respective sockets pass said signal;
   (c.) reporting an empty socket where indicated by said bistable circuits.

11. The method of claim 10, wherein each one of said series of memory sockets is connected to change the state of a respective one of said plurality of bistable circuits.

12. The method of claim 10, wherein said steps a. through c. are performed during a power-on-self-test.

13. A method of checking a memory circuit, comprising the steps of:
   (a.) reading a plurality of memory sockets to determine the presence of memory modules;
   (b.) if no memory modules are present in any of said memory sockets, then ending;
   (c.) sending a signal sequentially to each socket;
   (d.) configuring a plurality of bistable circuits in response to whether said signal is passed through respective sockets; and
   (e.) providing feedback to a user according to the state of said bistable circuits.

14. The method of claim 13, wherein said steps a. through c. are performed during a power-on-self-test.

15. A computer system, comprising:
   a microprocessor;
   a keyboard adapted to allow a user to create input data;
   an interface manager adapted to receive the input data and deliver the input data to the microprocessor;
   a hard disk adapted to store data;
   a disk interface adapted to exchange data between the microprocessor and the hard disk;
   a memory subsystem that is accessible by the microprocessor, the memory subsystem comprising:
      a plurality of memory slots adapted to receive either a memory module or a continuity module;
      detection circuitry adapted to detect (i) the presence of absence of a memory module and (ii) the presence or absence of a continuity module;
      executable instructions adapted to monitor the detection circuitry and generate a message to the user if the detection circuitry indicates the presence of a memory module in one of the plurality of memory slots and the absence of memory modules and continuity modules in any of the other slots.

16. The computer system of claim 15 wherein the memory subsystem is a Rambus Direct RDRAM subsystem.

17. A memory subsystem, comprising:
   a plurality of memory slots adapted to receive either a memory module or a continuity module;
   detection circuitry adapted to detect (i) the presence or absence of a memory module and (ii) the presence or absence of a continuity module;
   executable instructions adapted to monitor the detection circuitry and generate a message to the user if the detection circuitry indicates the presence of a memory module in one of the plurality of memory slots and the absence of memory modules and continuity modules in any of the other slots.

18. The memory subsystem of claim 17 wherein the memory subsystem is a Rambus Direct RDRAM subsystem.

19. A method of providing information about the status of a memory subsystem in a computer system, the memory subsystem having a plurality of memory sets adapted to receive either a memory module or a continuity module, the method comprising the acts of:
   determining whether at least one of the plurality of memory slots contains a memory module;
   if at least one of the plurality of memory slots contains a memory module, determining whether each of the remaining plurality of memory slots contains a continuity module;
   delivering a message to a user if at least one of the remaining plurality of memory slots contains neither a memory module nor a continuity module.

20. The method of claim 19 wherein the memory subsystem comprises a Rambus Direct RDRAM subsystem.

* * * * *